United States Patent [19]

Kästingschäfer et al.

[11] Patent Number: 5,253,816
[45] Date of Patent: Oct. 19, 1993

[54] MATERIAL CRUSHING ROLLER CONSTRUCTION

[75] Inventors: Gerhard Kästingschäfer, Wadersloh; Bernhard Peterwerth, Bad Laer; Helmut Krumme, Wadersloh, all of Fed. Rep. of Germany

[73] Assignee: Krupp Polysius AG, Fed. Rep. of Germany

[21] Appl. No.: 884,221

[22] Filed: May 11, 1992

Related U.S. Application Data

[63] Continuation of Ser. No. 566,077, Aug. 13, 1990, abandoned, which is a continuation-in-part of Ser. No. 382,114, Jul. 20, 1989, abandoned.

Foreign Application Priority Data

Aug. 23, 1989 [DE] Fed. Rep. of Germany ....... 3927884

[51] Int. Cl.$^5$ ................................................. B02C 4/30
[52] U.S. Cl. .................................... 241/227; 241/295; 492/38; 100/176
[58] Field of Search ............... 241/227, 294, 295; 29/124, 125; 72/195; 100/176, 155 R; 492/38, 39

[56] References Cited

U.S. PATENT DOCUMENTS

| | | | |
|---|---|---|---|
| 567,918 | 9/1896 | Redeker et al. | 29/124 |
| 615,906 | 12/1898 | Richardson | 29/124 X |
| 1,066,277 | 7/1913 | Hunter et al. | 241/295 |
| 1,105,844 | 8/1914 | Schaperjahn | 29/124 |
| 1,154,100 | 9/1915 | Wein | 241/295 |
| 1,353,633 | 9/1920 | Cothran | 29/124 |
| 1,584,493 | 5/1926 | Taylor | 29/124 X |
| 1,613,039 | 1/1927 | McLaren | 29/124 |
| 1,758,280 | 5/1930 | Evans | 29/124 |
| 1,897,836 | 2/1933 | Bristol | 29/124 X |
| 1,939,477 | 12/1933 | West | 29/124 X |
| 1,963,365 | 6/1934 | Herold | 29/124 |
| 2,021,913 | 11/1935 | Fallon | 29/124 |
| 2,665,502 | 1/1954 | Parkes | 29/124 X |
| 2,739,018 | 3/1956 | Collett . | |
| 3,090,105 | 5/1963 | Gibbar et al. | 29/124 X |
| 3,657,779 | 4/1972 | Granberry | 29/124 |
| 4,010,528 | 3/1977 | Böhmer | 29/125 |
| 4,561,156 | 12/1985 | Sun | 100/176 X |
| 4,577,673 | 3/1986 | Harada et al. . | |
| 4,617,709 | 10/1986 | Gundlach | 241/294 X |
| 4,720,207 | 1/1988 | Salani | 492/47 |
| 4,752,145 | 6/1988 | Schelshorn et al. . | |
| 4,752,145 | 6/1988 | Schelshorn et al. | 29/124 X |
| 4,886,218 | 12/1989 | Bradley et al. | 241/294 |
| 4,964,201 | 10/1990 | Kajitani . | |
| 5,000,392 | 3/1991 | Kastingschäfer et al. | 241/294 |

FOREIGN PATENT DOCUMENTS

| | | | |
|---|---|---|---|
| 308069 | 9/1918 | Fed. Rep. of Germany | 492/38 |
| 378510 | 1/1922 | Fed. Rep. of Germany | 492/38 |
| 352688 | 5/1922 | Fed. Rep. of Germany | 492/38 |
| 559416 | 9/1923 | France | 492/39 |
| 763182 | 4/1934 | France | 492/38 |
| 1131552 | 2/1957 | France | 29/124 |
| 569137 | 5/1945 | United Kingdom | 492/38 |
| 1400944 | 7/1975 | United Kingdom | 492/38 |

OTHER PUBLICATIONS

Bergandahl, Hans-Gerog: "Walzenpressen für die Brikettierung von heibem Eisenschwamm" in the offprint of Facherichte Hüttenpraxis vol. 10/81.

*Primary Examiner*—Mark Rosenbaum
*Assistant Examiner*—Frances Chen
*Attorney, Agent, or Firm*—Learman & McCulloch

[57] ABSTRACT

The invention relates to a machine for compacting and/or crushing bulk material, in which two rollers which can be pressed together at high pressure each consist of a main roller body and a roller shell which is releasably connected to the main roller body and is composed of individual segments. Each of the individual segments has one single lug projecting in the circumferential direction on the front long side in the direction of rotation of the roller and one single complementary recess on the rear long side in the direction of rotation of the roller. The generatrices of the outer surfaces of the segments point in the circumferential direction and run radially with respect to the roller axis. This results in a simple construction of the segments and a high degree of security against tilting.

11 Claims, 3 Drawing Sheets

MATERIAL CRUSHING ROLLER CONSTRUCTION

This is a continuation of copending application Ser. No. 07/566,077 filed on Aug. 13, 1990 now abandoned, which is a continuation-in-part of copending application Ser. No. 07/382,114 filed on Jul. 20, 1989, now abandoned.

BACKGROUND OF THE INVENTION

The invention relates to a machine for compacting and/or crushing bulk material using opposing rollers, as well as a roller segment for use in such a machine.

A machine for hot briquetting using opposing rollers and a roller segment are known from an article by Bergendahl, Hans-Georg: "Walzenpressen für die Brikettierung von heissem Eisenschwamm" in the offprint of Fachberichte Hüttenpraxis Vol. 10/81. In particular, this article describes two rollers which can be pressed against one another at high pressure. Each roller comprises a main roller body and a roller shell which is releasably connected to the main roller body and is composed of individual segments, and the individual segments each have one single projecting lug on the front long side in the direction of rotation and one single recess on the rear long side in the direction of rotation.

In this known construction the outer faces of the projecting lugs and recesses of the segments which point in the circumferential direction run to some extent at an angle to the plane through the roller axis. As a result, at a given pressure between two rollers the maximum specific surface pressure between the segment and the main roller body is reduced. Surface pressures which are too high lead to deformations of the surface of the main roller body and cause tilting of these segments.

Furthermore, the production of these known segments, and in particular the machining of the individual segment surfaces, is relatively costly.

The object of the invention, therefore, is to provide a bulk material compacting and/or crushing machine using opposing rollers and a roller segment therefor wherein the construction of the segment is simplified whilst at the same time guaranteeing security against tilting.

SUMMARY OF THE INVENTION

This object is achieved according to the invention by providing roller segments each characterized by generatrices of those outer surfaces of the segments pointing in the circumferential direction running radially with respect to the roller axis.

In comparison with the known construction described above, the solution according to the invention—whilst offering almost the same security against tilting—is distinguished by substantially simpler manufacture, since the individual segments are produced as simple castings and all segment surfaces can be machined in a simple manner.

Further features of the invention are the subject matter of the subordinate claims and are explained in greater detail in connection with the following description of some embodiments which are illustrated in the drawings.

DETAILED DESCRIPTION OF THE INVENTION

Figure 1:
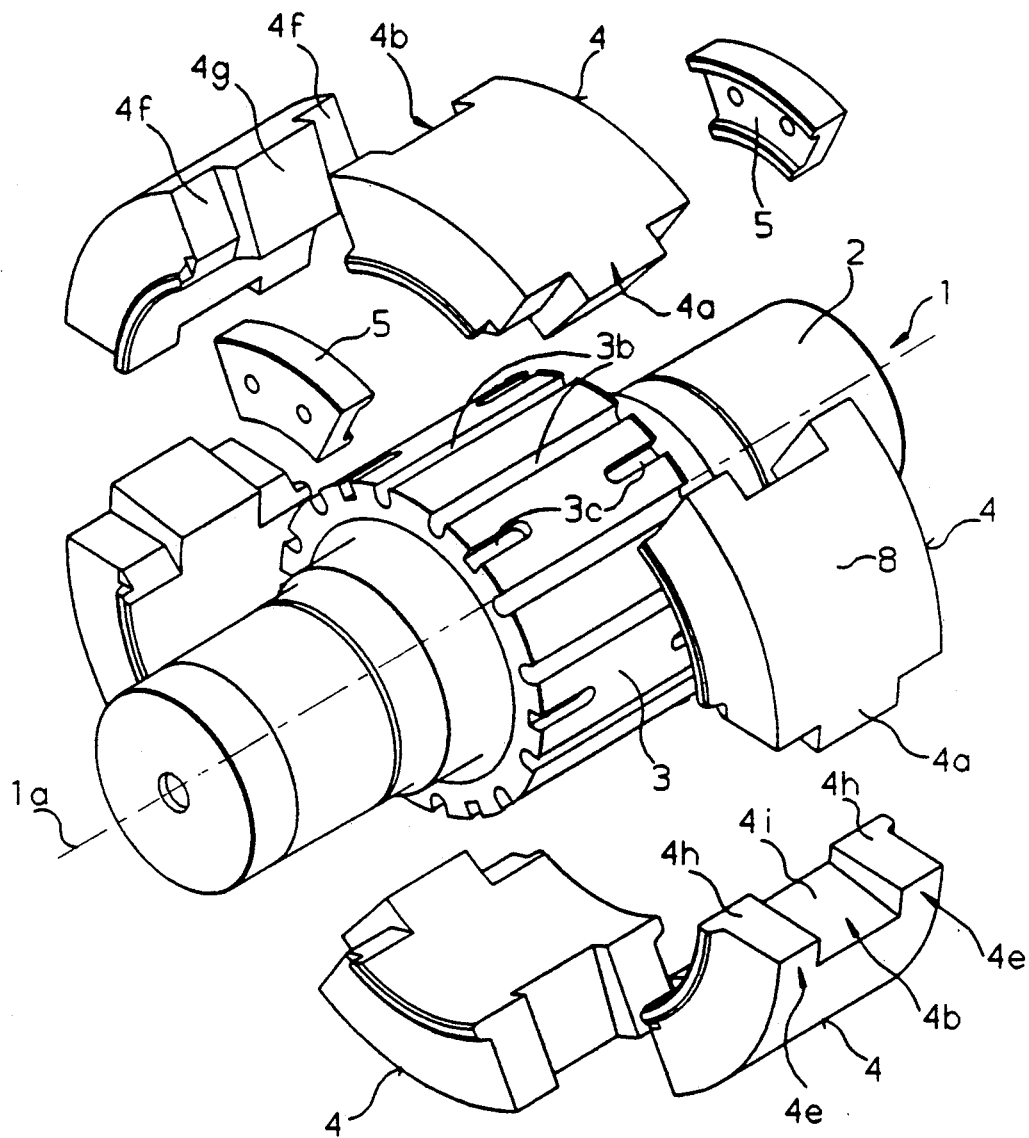
FIG. 1 shows an exploded view of a roller.

The roller illustrated in FIG. 1 comprises a main roller body 3 arranged on a shaft 2 as well as a roller shell which is releasably connected to the main roller body 3 and composed of individual segments 4. Two clamping elements 5 which engage laterally on the segments are provided in each case for fixing the individual segments 4 on the main roller body 3.

The bearing surfaces of the main roller body 3 and the segments 4 are constructed as cylindrical surfaces.

Each of the individual segments 4 has one single lug 4a projecting in the circumferential direction on the front long side in the direction of rotation and one single complementary recess 4b on the rear long side in the direction of rotation of the roller 1, the lug 4a and the recess 4b being arranged symmetrically with respect to the central plane 4c of the segment 4 running at right angles to the roller axis 1a (in this connection cf. also FIGS. 4 to 8).

In the circumferential direction the individual segments 4 have the part-surfaces 4f and 4g on the side of the lug 4a and the part-surfaces 4h and 4i on the side of the recess 4b. The generatrices of the outer surfaces of the segments point in the circumferential direction and are formed from the part-surfaces 4f and 4g as well as 4h and 4i, and run radially with respect to the roller axis 1a.

Between adjacent segments 4 of the roller shell there can be a clearance of up to approximately 10 mm, preferably a clearance of the order of magnitude of the casting tolerance, for example 2 to 5 mm.

Figure 2:
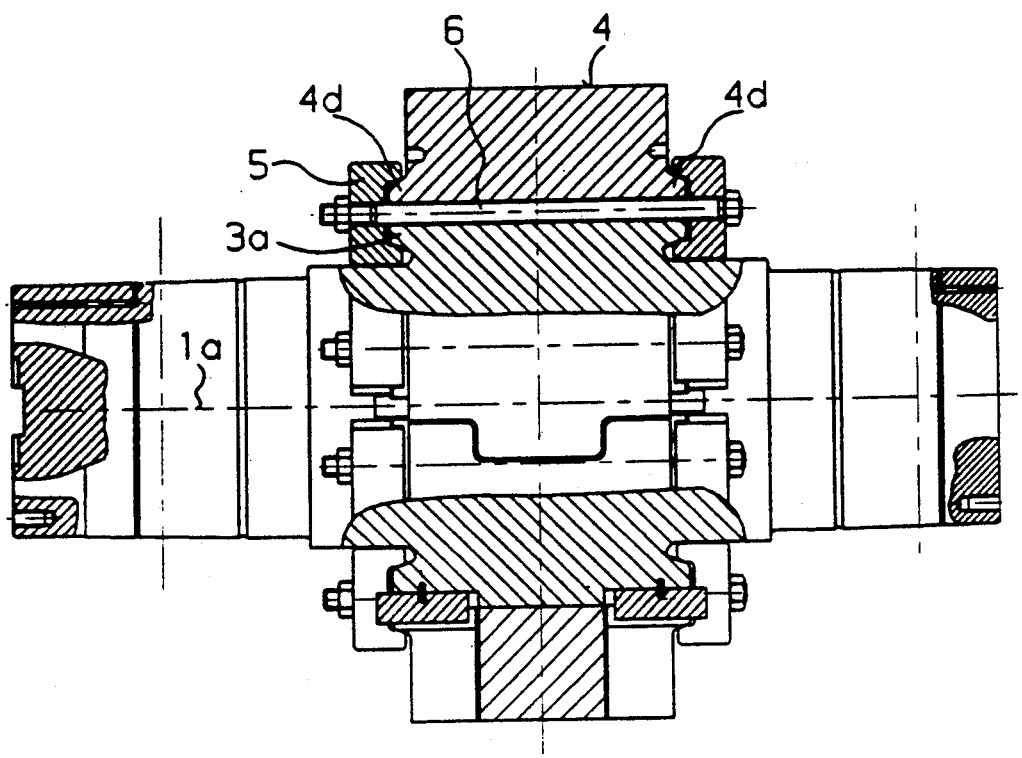
FIG. 2 shows a part-sectional representation of the roller along the line II—II in FIG. 3.
Figure 3:
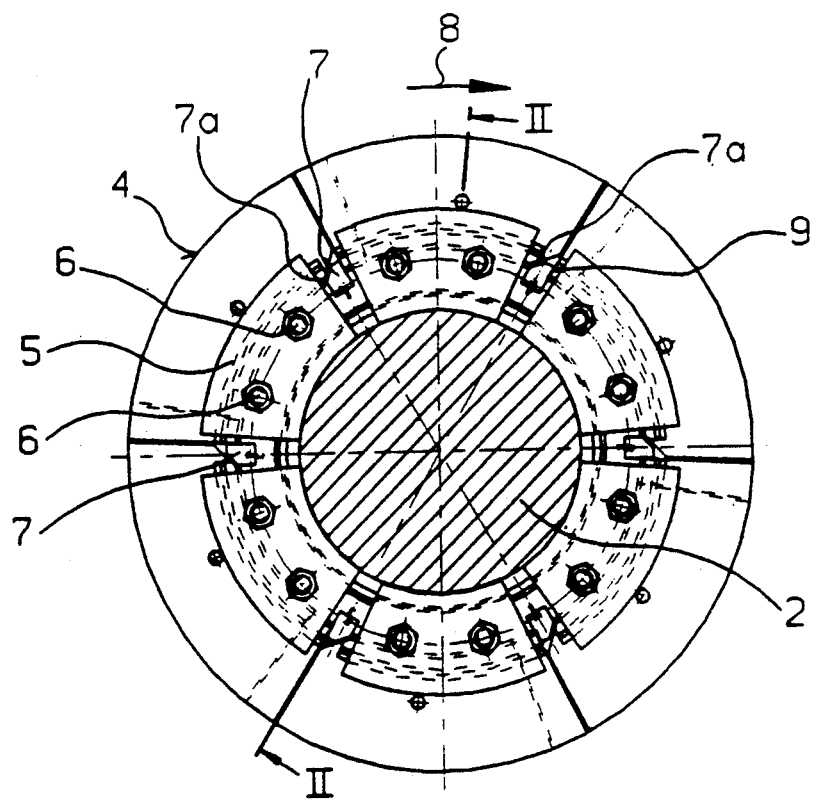
FIG. 3 shows a side view of the roller.

As can also be seen in FIGS. 2 and 3, the segments 4 and the main roller body 3 are each provided with laterally projecting lugs 4d and 3a respectively. U-shaped clamping elements which engage in the axial direction on both sides on the lugs 4d and 3a are braced together by means of tightening screws 6. The tightening screws 6 are received in axially extending grooves 3b of the main roller body 3. In this way all segments 4 are fastened to the main roller body 3 in each case by two clamping elements 5. However, other fixing means are also possible within the scope of the invention, for example, shrink rings, adjusting springs, radially arranged screws or spring clips tensioned with bolts.

Adjusting springs are provided for additional fixing of the segments 4 in the direction of rotation. In order to receive the adjusting springs 7, two grooves 3c are provided per segment 4 adjacent to the two end faces of the main roller body 3. The length of the grooves 3c corresponds approximately to the length of the regions of the long side of the segment 4 laterally adjoining the lug 4a. The adjusting springs 7 set into the grooves 3c have surfaces 7a inclined in the direction of rotation of the roller 1. The edge in the region laterally adjacent to the lug 4a and the bearing surface of the segment 4 on the main roller body 3 has a corresponding inclination.

In the normal operation of the machine the segments 4 are held on the main roller body 3 by the clamping elements 5. In the event of extreme loads relative movements between the segments 4 and the main roller body 3, so that the segments attempt to twist on the main roller body against the direction of travel of the roller. These relative movements are prevented by the adjusting springs 7. The segments are supported on the radially extending surface of the adjusting springs 7. The chamfering of the adjusting springs (surface 7a) is carried out for reasons of space, and the chamfered surfaces are always unstressed.

In the drawing (FIG. 3) a gap 9 of approximately 2 mm can be seen between the segment 4 and the adjacent adjusting spring 7. This gap 9 should compensate for settlements in the clamp connection. Thus in the event of extreme loads the segment makes a relative movement of 2 mm with respect to the main roller body 3 and the adjacent adjusting spring and then comes in rest on the adjusting spring, which prevents any further rotary movement.

The lug 4a and the recess 4b of the segment illustrated in FIG. 1 have a rectangular outer contour when viewed in the radial direction. The recess 4b is defined by two lateral projections 4e when viewed in the axial direction. The axial length of the lug 4a and the recess 4b in the region of the root of the lug or the mouth of the recess corresponds approximately to half the axial length L of the segment 4. For the two lateral regions—viewed in the axial direction—of the lug 4a and recess 4b there remains in each case a quarter of the axial length L of the segment 4. The depth of the lug 4a and the recess 4b measured in the circumferential direction corresponds to an angle in a segment x of 3 to 15°, preferably 5 to 10°. The depth of the lugs measured in the circumferential direction advantageously corresponds approximately to the arc measure of the region between the rollers in which the grinding pressure acts.

The durability of segmented rollers is influenced decisively by the surface pressure between the segments 4 and main roller body 3. (Wobbling of the segments). The distribution of the surface pressure in the bearing surface between the segments 4 and the main roller body 3 is influenced by the non-uniform pressure distribution in the gap between two rollers 1 in the direction of the roller axis 1a and by the orientation of the resulting grinding pressure with respect to the segment 4. By means of the orientation of the resulting force with respect to the segment 4 the maximum surface pressures and the maximum tilting moment occur on the side of the segment running out of the gap, and the pressure in the gap above the axial length of the segment in the central region is greater than in the edge regions.

In the construction of the segments according to the invention the different pressure stresses and the differing tilting moments on the sides of the segment running into and out of the gap are taken into account by the shaping and arrangement of the segments 4 on the main roller body 3.

The segments 4 are arranged in the direction of rotation (arrow 8) on the main roller body 3 in such a way that first of all the side of the segment with the projecting lug 4a runs into the gap formed by two rollers 1.

The most highly stressed part of the segment 4 in the region of the recess 4b (approximately 65% of the total force) runs out of the gap as the first part of the rear long side of the segment. In this case the lateral projections 4c act as supports and thus prevent unacceptably high surface pressures as well as wobbling of the segments. The subsequent running out of the projections 4e is not critical because of the lower pressure stress (approximately 35% of the total force). The pressure stress of the incoming side of the segment (i.e. the front long side when viewed in the direction of rotation of the roller) is substantially lower and therefore not critical because of the direction in which the grinding force acts.

Figure 4:
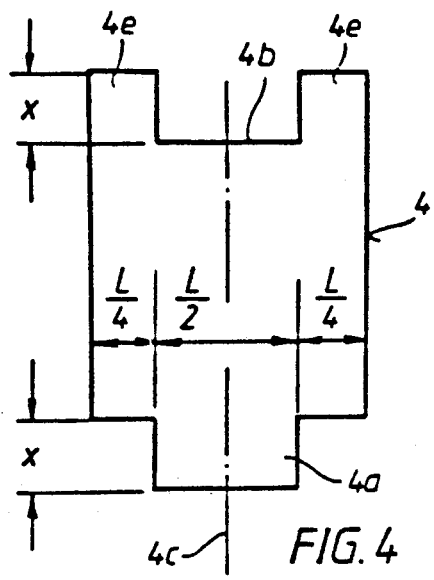
FIGS. 4 to 8 show views of the development of different embodiments of the segments.
Figure 5:
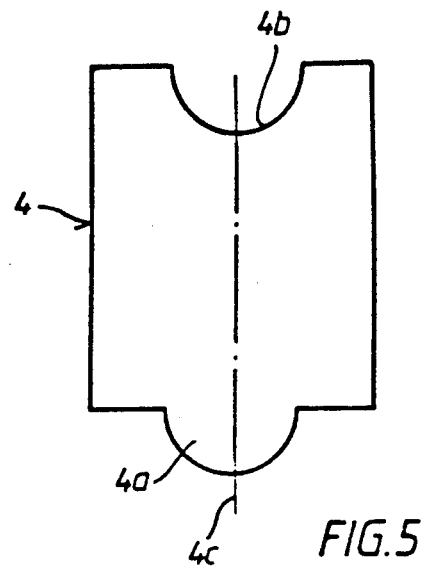

In the further embodiments according to FIGS. 5 to 8 the same reference numerals are used for the same parts as in FIG. 4. In the embodiment according to FIG. 5 the lug 4a and the recess 4b of the segment 4 are constructed with a circular outer contour.

Figure 6:
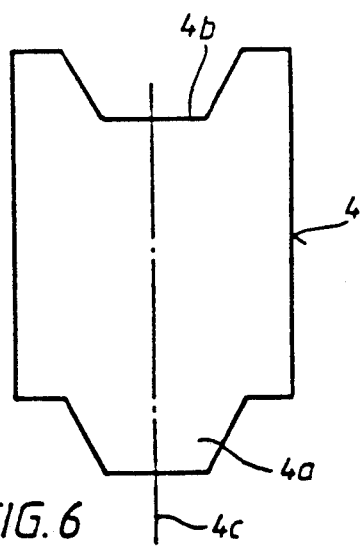

In the embodiment according to FIG. 6 the lug 4a and the recess 4b have a trapeziform outer contour.

Figure 7:
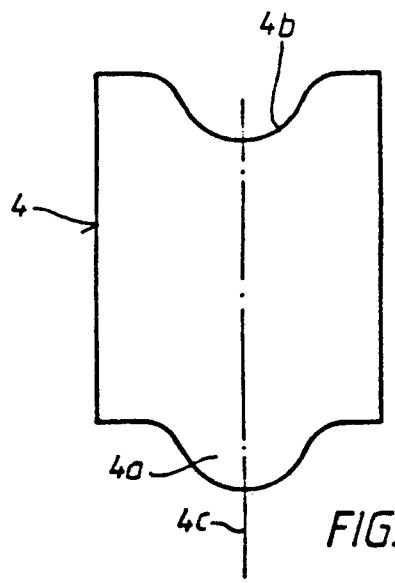
Figure 8:
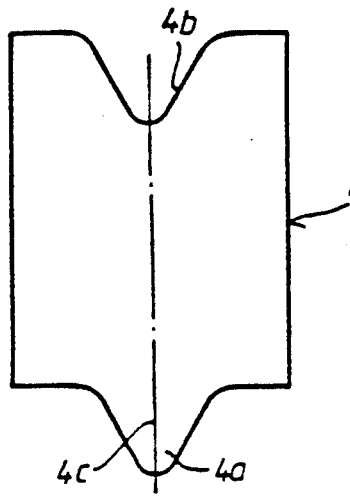

The segments illustrated in FIGS. 7 and 8 have an outer contour which consists of a circular central part and straight parts adjoining it on both sides. The straight parts then merge with rounded edges into the two lateral paraxial regions. The lug 4a or the recess 4b of the segment illustrated in FIG. 8 are of somewhat narrower construction by comparison with the embodiment according to FIG. 7. Otherwise the dimensions according to FIG. 4 also apply to the embodiments according to FIGS. 5 to 8.

The roller shell which is composed of releasable individual segments makes it possible for one or all segments to be replaced if required. For this purpose it is merely necessary to remove the corresponding clamping elements.

We claim:

1. A material crushing roller for applying compressive force on bulk material and comprising a plurality of like, rigid segments in encircling relation about a roller body rotatable about an axis, each segment having between its leading and trailing ends an outer arcuate material engaging surface spanning the width of such segment, each segment having at its leading end a surface beyond which a single lug projects circumferentially in the direction of rotation, each of said lugs being of less width than that of such segment and having an outer surface extending in arcuate prolongation of and at the level of the material engaging surface, a leading end surface and a pair of parallel sides, each segment having at its trailing end a surface having one recess therein, said recess having spaced sides and a base surface and being of such width as snugly to accommodate the lug of the adjacent segment, the lug and recess of each segment being symmetrical with respect to the central plane of such segment extending at right angles to the axis of rotation of said roller body, each segment being characterized in that each of the surfaces of the leading and trailing ends thereof, the leading end surface of said lug, and the base surface of said recess extend radially with respect to said axis, the outer surface of each of said segments and the outer surface of each of said lugs having the same radius from said axis.

2. A roller according to claim 1 wherein each lug and each recess have a rectangular outer contour when viewed in the radial direction.

3. A roller according to claim 1 wherein each lug and each recess have a circular outer contour when viewed in the radial direction.

4. A roller according to claim 1 wherein each lug and each recess have a trapeziform outer contour that converges in the direction of rotation when viewed in the radial direction.

5. A roller according to claim 1 wherein each lug and each recess when viewed in the radial direction have an outer contour which consists of a circular central part and straight parts adjoining on both sides.

6. A roller according to claim 1 wherein the leading end of each lug and the base surface of each recess have a length corresponding substantially to half the axial length of the associated segment.

7. A roller according to claim 1 wherein the circumferential length of each lug and the circumferential depth of each recess subtends an angle of 3 to 15° relative to the roller axis.

8. A roller according to claim 1 including clamping elements for fixing the individual segments on the roller body, said clamping elements engaging the segments on two sides wholly inwardly of the outer arcuate material engaging surface, said clamping elements bracing each segment relative to the roller body by means of axial tightening screws accommodated in grooves of the roller body.

9. A roller according to claim 1 wherein the circumferential depth of each lug corresponds approximately to the length of the region of the roller on which the compressive force acts.

10. A roller according to claim 1 including adjusting springs accommodated in grooves in said roller body for fixing the segments, there being two grooves for each segment adjacent to two end faces of the roller body, such grooves each extending over substantially one quarter of the axial length of the roller body and being located at a contact point of two adjacent segments.

11. A roller according to claim 10 wherein a gap is provided between adjacent segments and the adjusting springs to compensate for relative movement between the segments and the roller body.

* * * * *